United States Patent [19]
Carney

[11] Patent Number: 5,205,762
[45] Date of Patent: Apr. 27, 1993

[54] HIGH FREQUENCY PATCH CORD DATA CONNECTOR

[75] Inventor: William V. Carney, Oyster Bay, N.Y.

[73] Assignee: Porta Systems Corp., Syosset, N.Y.

[21] Appl. No.: 803,424

[22] Filed: Dec. 6, 1991

[51] Int. Cl.⁵ ............................................ H01R 13/648
[52] U.S. Cl. .................................... 439/607; 439/108
[58] Field of Search ............... 439/59, 92, 95, 96, 439/98, 101, 108, 260, 607, 608, 610, 629, 630, 636, 637

[56] References Cited

U.S. PATENT DOCUMENTS

| | | | |
|---|---|---|---|
| 3,138,675 | 6/1964 | Krone | 200/51 |
| 3,399,372 | 8/1968 | Uberbacher | 339/17 |
| 3,766,513 | 10/1973 | Carre | 339/31 |
| 4,149,211 | 4/1979 | De Hoff | 361/119 |
| 4,345,294 | 8/1982 | Forberg et al. | 361/119 |
| 4,410,225 | 10/1983 | Stoewe et al. | 339/31 |
| 4,659,155 | 4/1987 | Walkup et al. | 339/14 |
| 4,741,711 | 5/1988 | Singer, Jr. | 439/620 |
| 4,840,568 | 6/1989 | Burroughs et al. | 439/49 |
| 4,846,735 | 7/1989 | Teichler et al. | 439/709 |
| 4,875,868 | 10/1989 | Cwirzen et al. | 439/188 |
| 5,024,609 | 6/1991 | Heinz Piorunneck | 439/637 |
| 5,026,292 | 6/1991 | Pickles et al. | 439/108 |
| 5,035,632 | 7/1991 | Rudoy et al. | 439/108 |
| 5,051,099 | 9/1991 | Pickles et al. | 439/108 |
| 5,122,065 | 6/1992 | Dudek et al. | 439/108 |
| 5,130,896 | 7/1992 | Babb et al. | 439/607 |
| 5,141,445 | 8/1992 | Little | 439/607 |
| 5,160,273 | 11/1992 | Carney | 439/108 |

OTHER PUBLICATIONS

Telephony, 100 Pair Protected I.D.C. Connect/Disconnect-Terminal Block, Mars Alcatel, 2 pages.
"La Connection", Henry Pouyet 1985 Catalog Standard Products, 6 pages.

Primary Examiner—Paula A. Bradley
Attorney, Agent, or Firm—Fitzpatrick, Cella, Harper & Scinto

[57] ABSTRACT

A patch cable assembly for making patch connections between connector blocks while protecting against cross talk and signal interference. The assembly includes a patch cable with transmit and receive conductors and a surrounding ground sheath and a printed circuit board insert at the end for insertion into a patch connector block. The insert has an electrically conductive shield between transmit and receive conductors 29 Claims, 11 Drawing Sheets

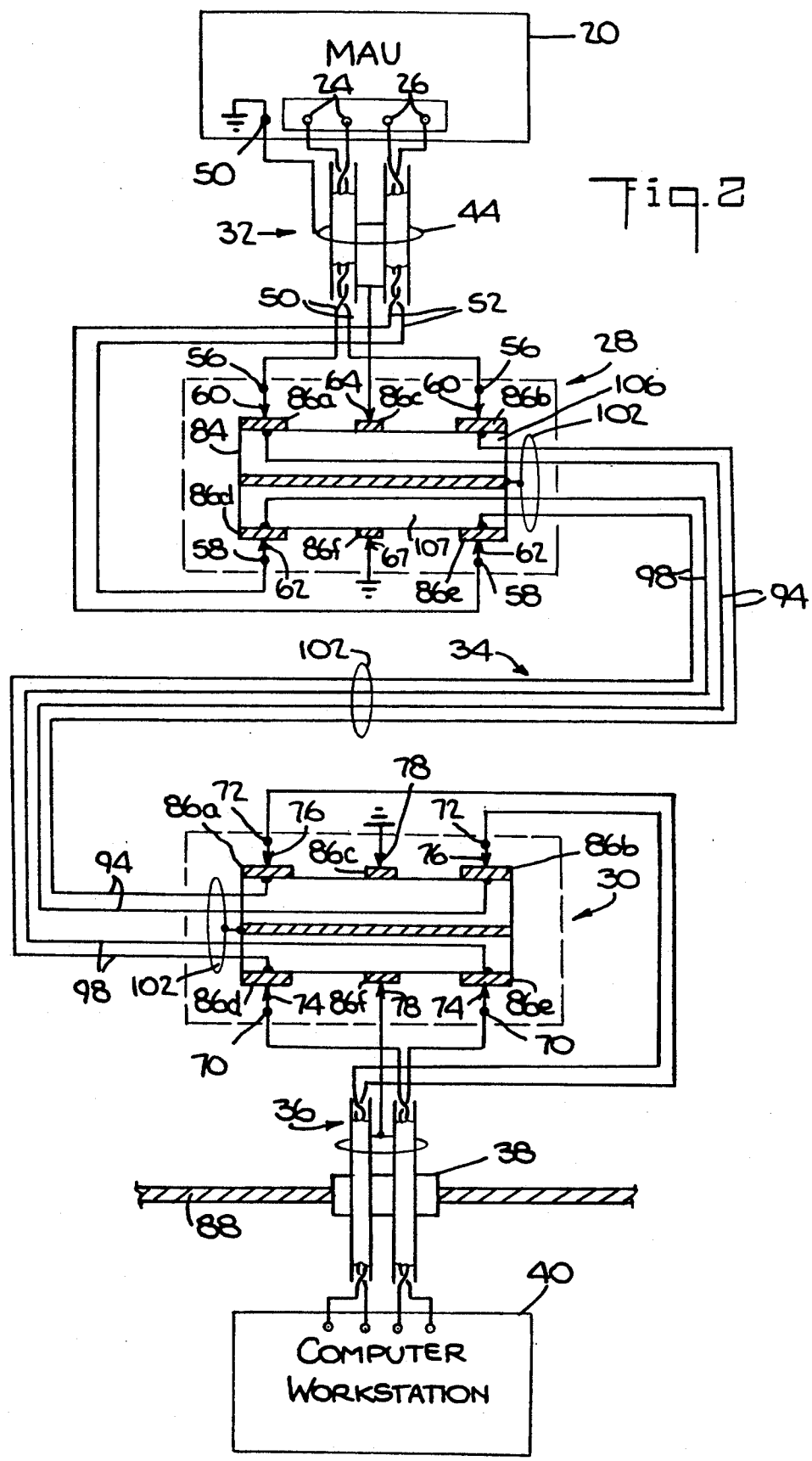

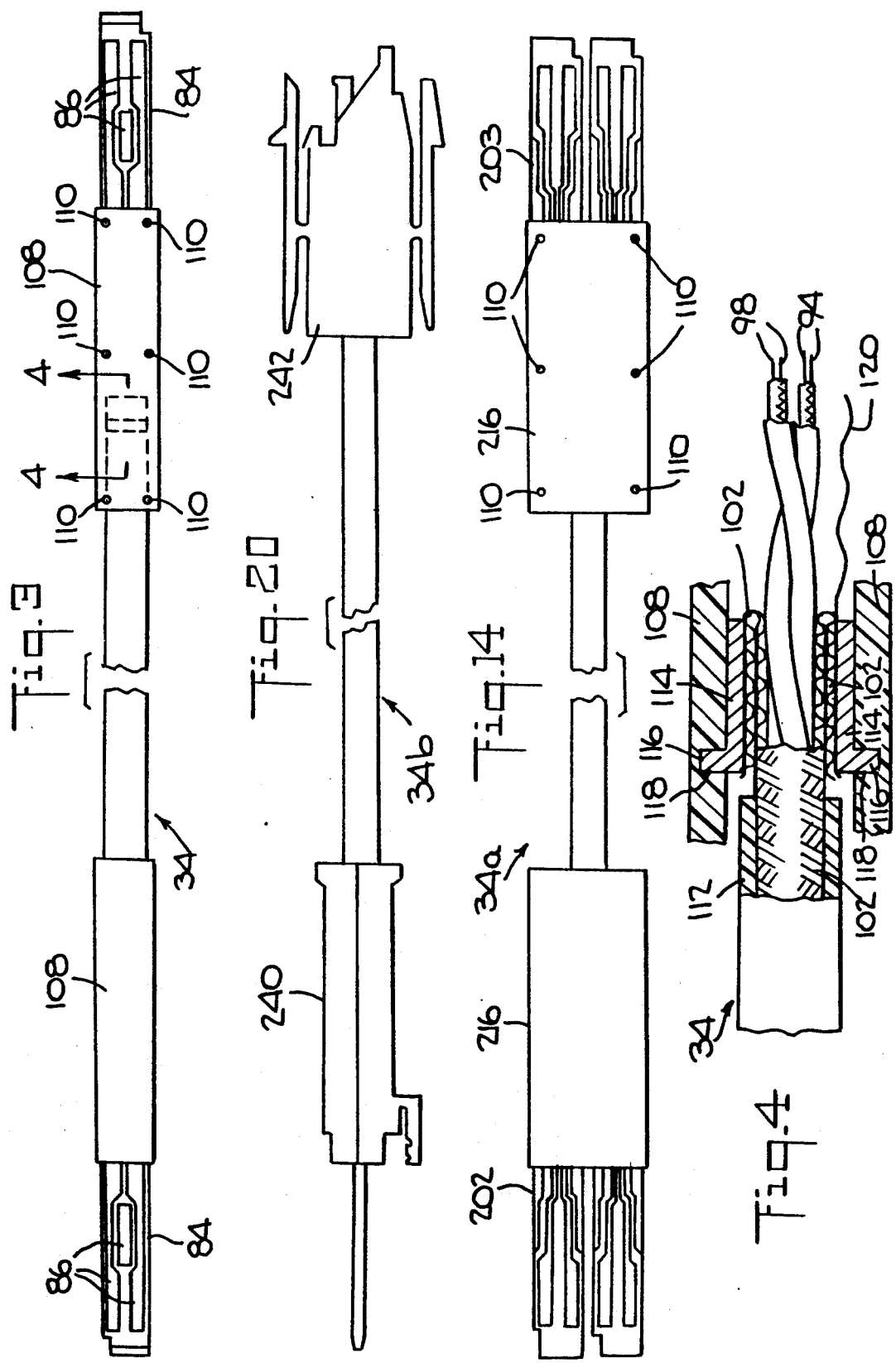

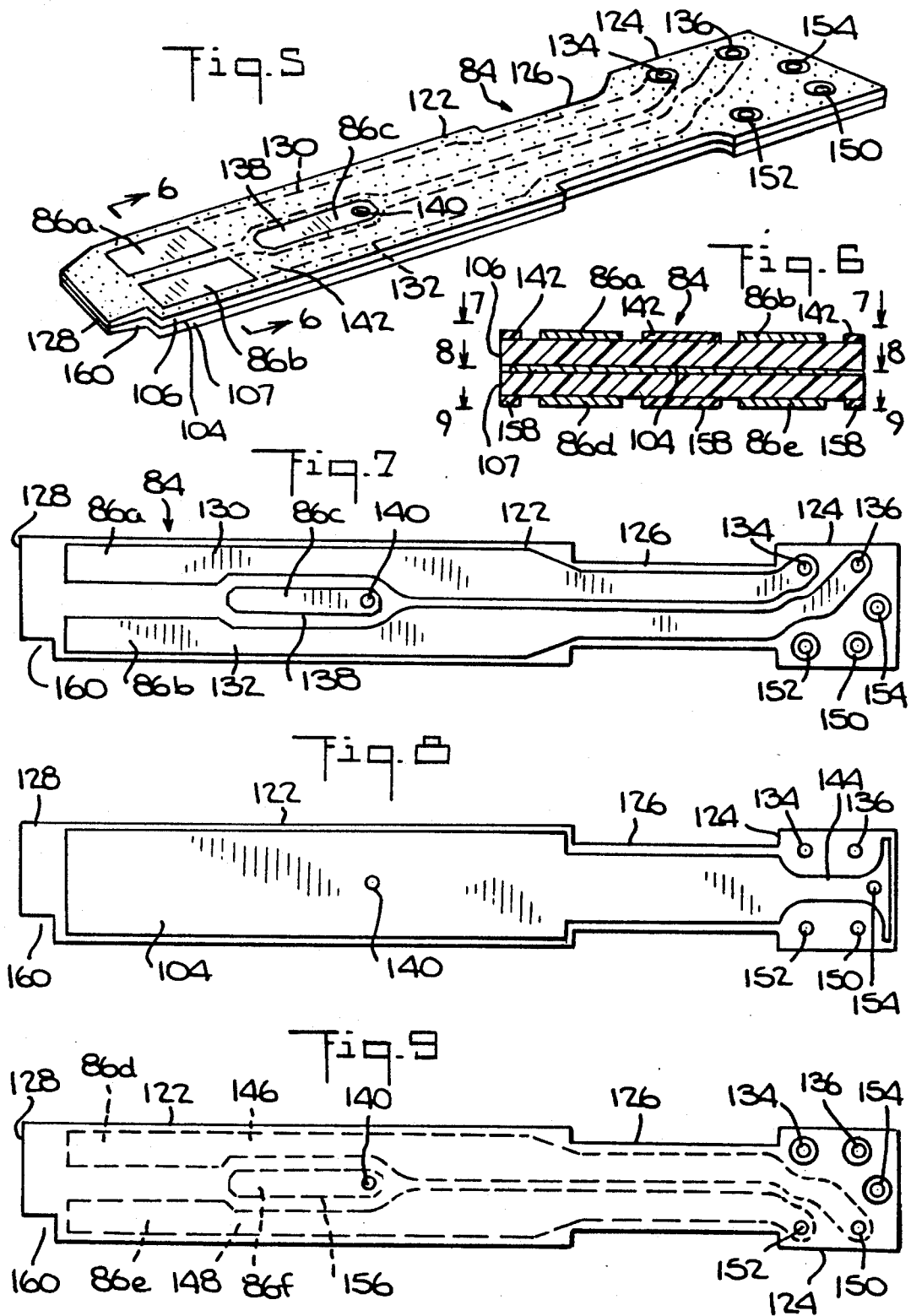

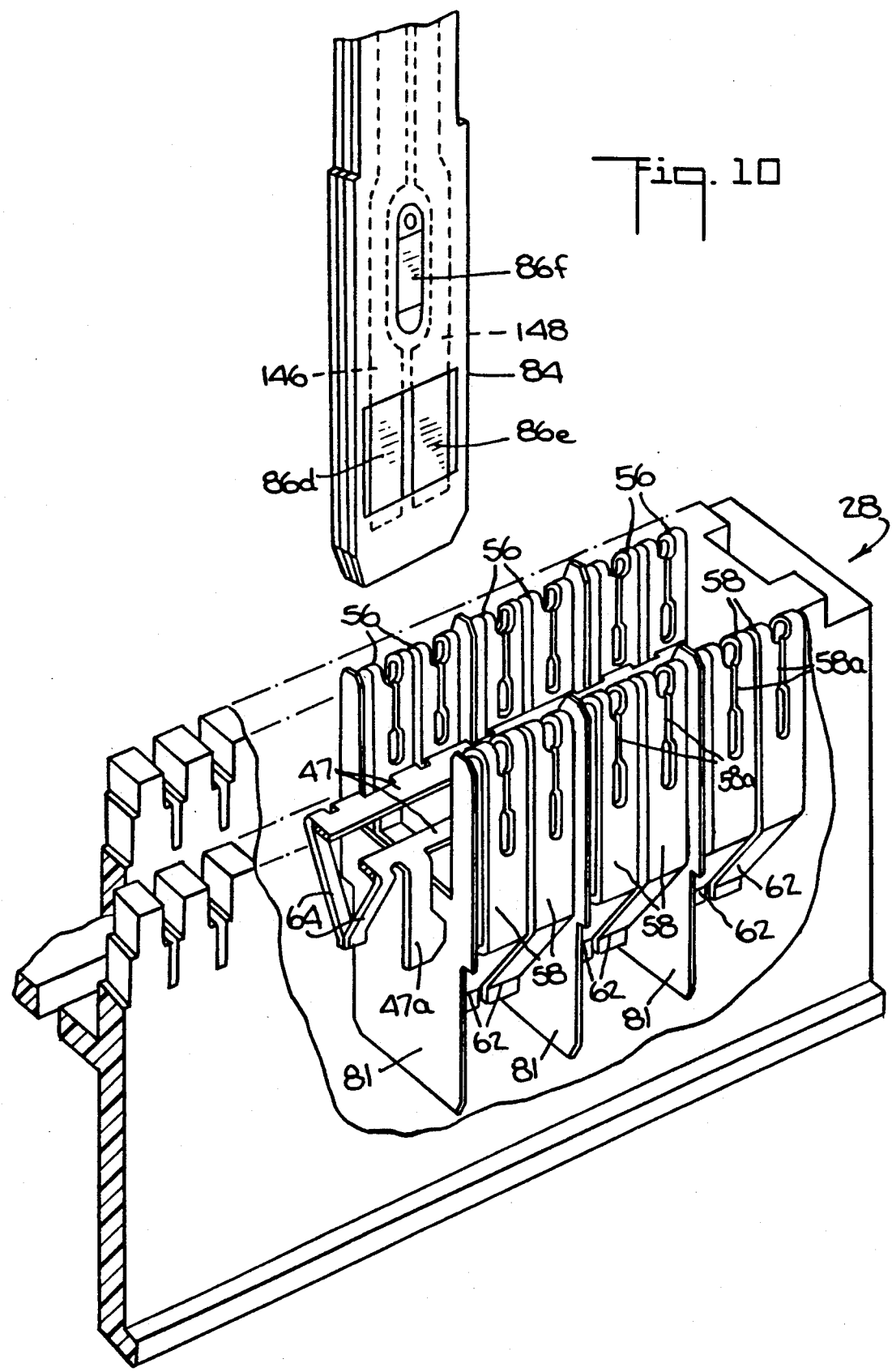

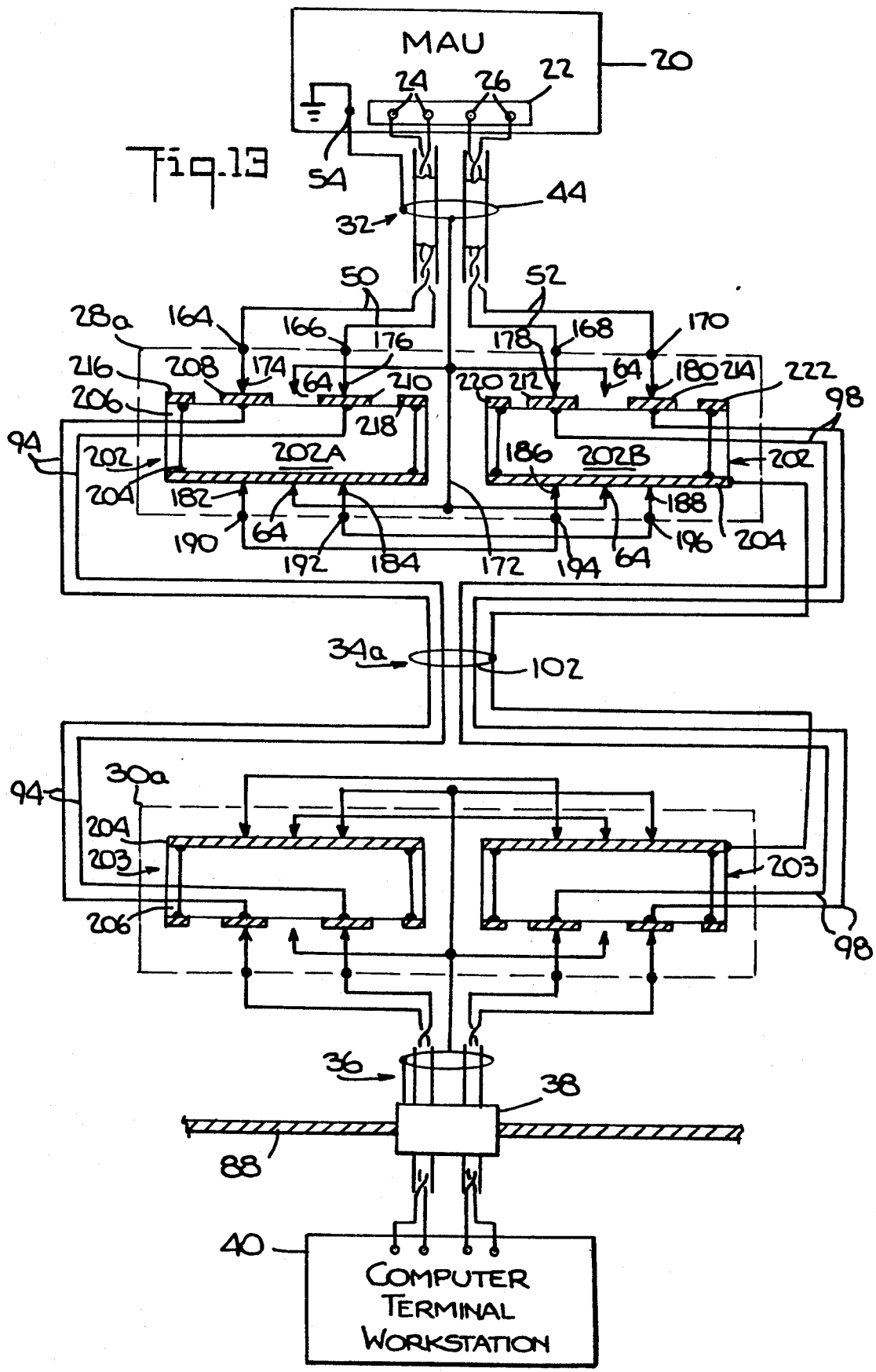

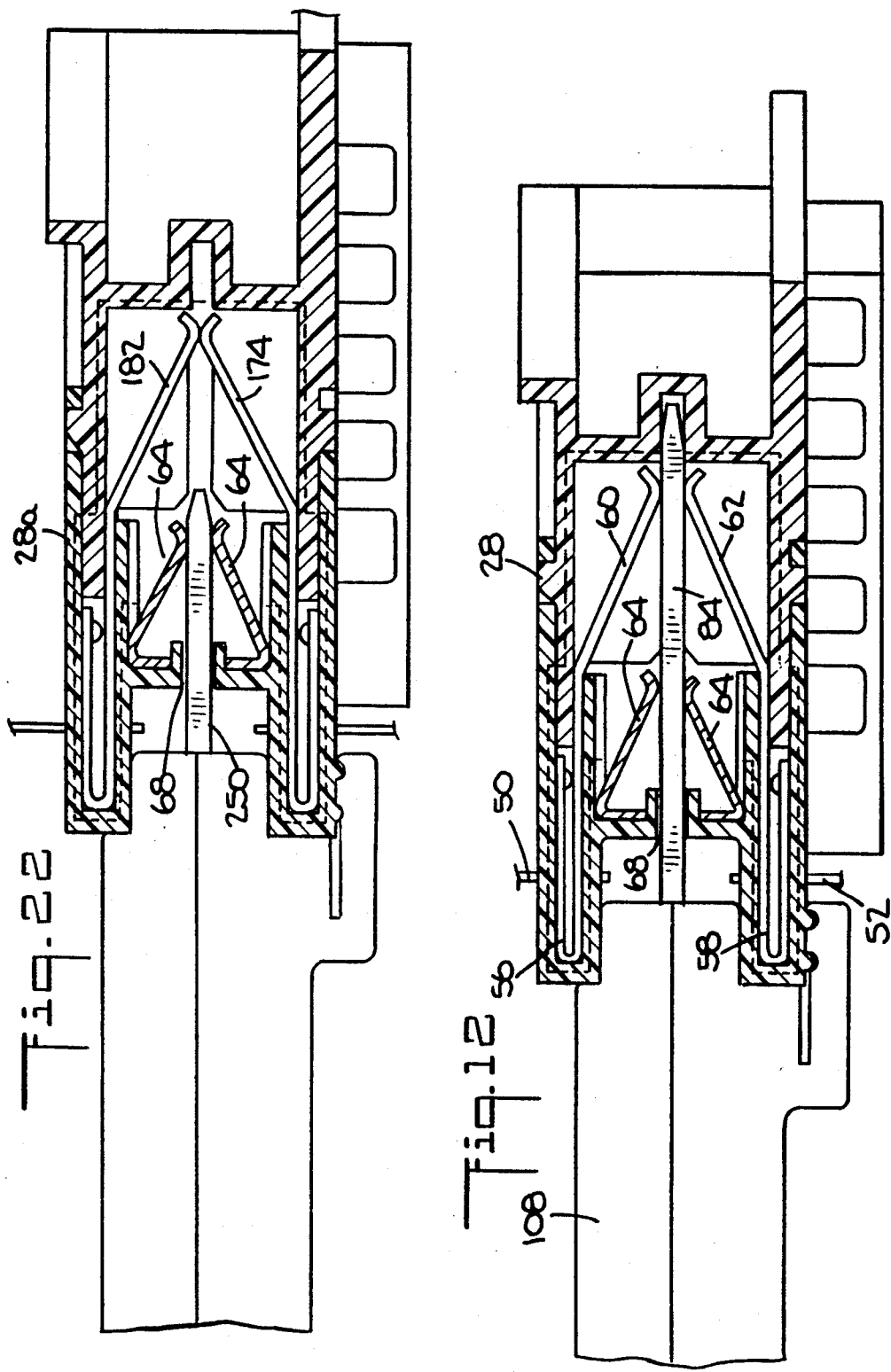

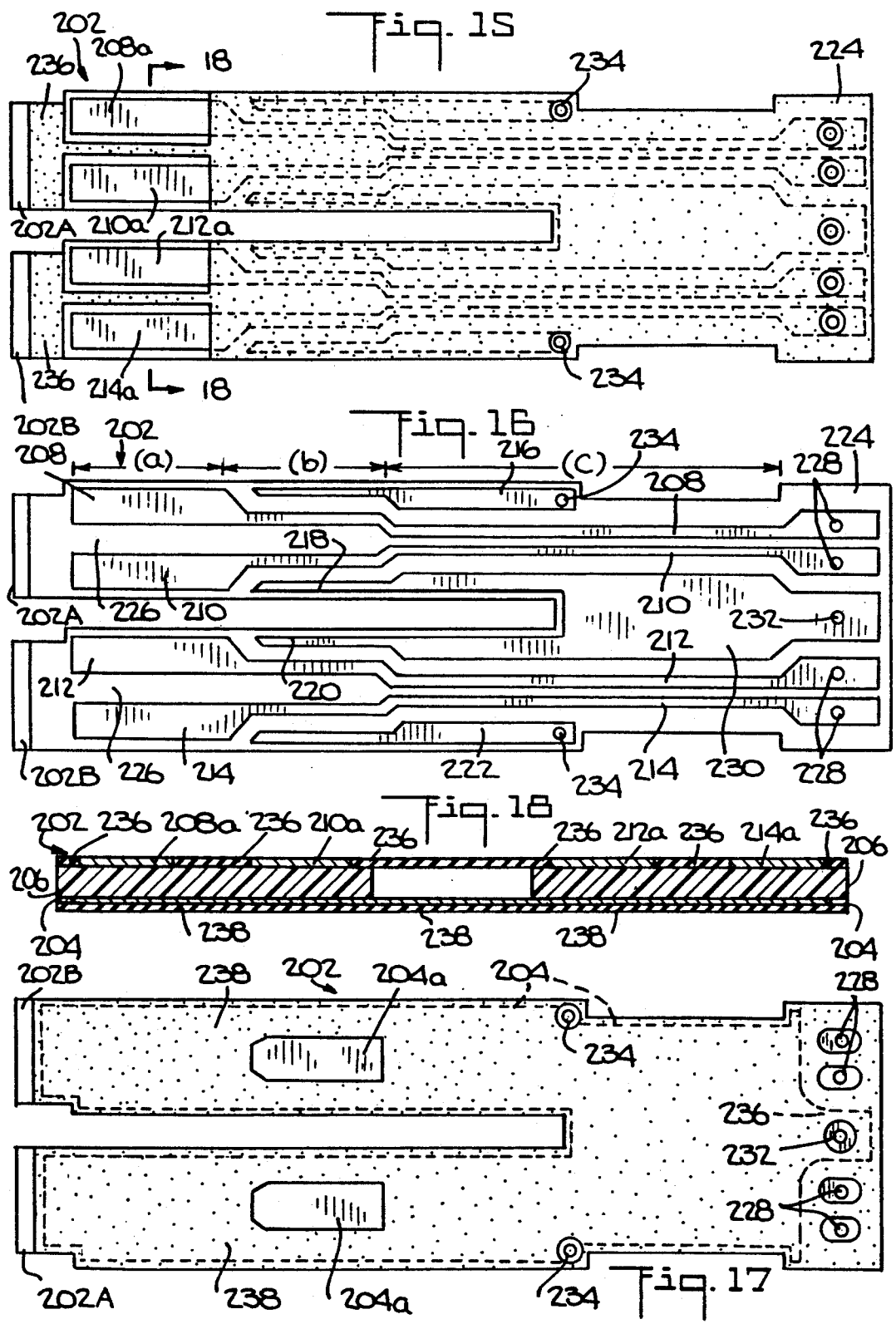

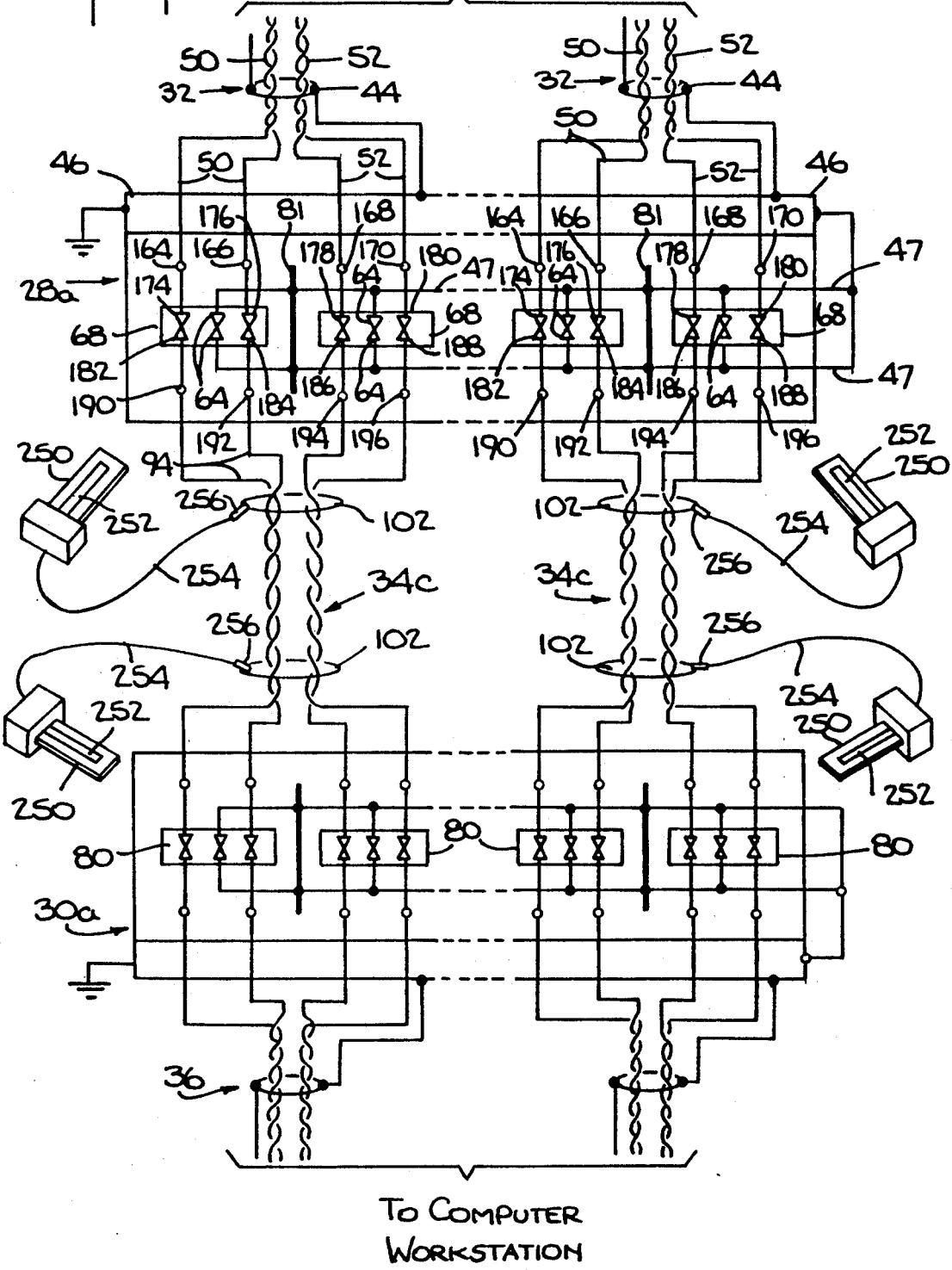

HIGH FREQUENCY PATCH CORD DATA CONNECTOR

BACKGROUND OF THE INVENTION

1. Field of the Invention

This invention relates to electrical connectors for high frequency environments and more particularly it concerns novel patch cord type connectors for use in multiple access wiring systems for computer networks.

2. Description of the Prior Art

It is known to provide computer systems with a plurality of separate but mutually interconnected terminals or work stations. In fact, many buildings are now wired with computer lines leading to several locations so that computer work stations may be connected to each other and to centralized computer facilities according to the particular needs of the occupants. As the occupants or their needs change, it is often necessary to rearrange the organization of the wiring between the computer work stations and the centralized computer facilities. This is done by means of patch cords which interconnect connector blocks located in a wiring closet in the building.

For economy of space, particularly since it is often necessary for very large numbers of computer terminals to be accommodated to many different systems and configurations, the patch cord connections must be arranged very close to each other. This close spacing of patch connectors has raised problems because computer systems operate at very high frequencies and the signals from one set of connectors may interfere with and degrade the quality of the signals on an adjacent set of connectors. This problem, sometimes referred to as "cross talk", becomes more severe as the connectors are positioned closer to each other.

U.S. patent application No. 07/719,939, filed Jun. 24, 1991, now U.S. Pat. No. 5,160,273, and assigned to the assignee of the present invention, discloses novel connector blocks which maintain closely spaced wiring terminals for selective interconnection. Each pair of terminals in these connector blocks is formed with spring finger which are normally in contact but are spread apart when a printed circuit board is inserted between them. The block itself, which is made of molded plastic, is provided with internal electrically conductive shields. These shields are arranged in the block to provide electromagnetic isolation between groups of terminals and associated spring fingers.

A need for further electromagnetic isolation arises when the connector block is used as a patching device. In that case the printed circuit boards inserted between the spring fingers are provided with patching cables which in turn connect the spring fingers to computer terminals or work stations. Before a printed circuit board is inserted, the normally contacting spring fingers in each pair are mutually short circuited and need not be electromagnetically isolated from each other. However when the printed circuit board is inserted to separate the spring fingers and connect them to a computer work station, the signals on the now separated spring fingers are no longer the same and they must therefore be electromagnetically isolated from each other.

A further problem which occurs in the use of connector blocks in patching systems is the maintenance of a continuous ground shield throughout the system. Although the various cables used in the system have electrically conductive sheaths which are connected to ground terminals at one end or the other, the arrangements known up to now did not provide for a continuous ground from the centralized computer facility through the patch connector blocks to the individual computer work stations.

SUMMARY OF THE INVENTION

The present invention provides a novel printed circuit patch cord construction and associated patching system that enable close spacing of groups of electrical terminals and connections while maintaining the terminals and connections electromagnetically isolated from each other when the patch cord is inserted into a multiple terminal connector block. The present invention also provides for a continuous ground connection for shielding throughout a patch connection system.

According to one aspect of the invention there is provided a novel patch cable and connector assembly for making a patch connection into a high wiring density connector block having separable spring finger contacts. This novel assembly comprises a cable which contains transmit and receive signal conductors and a printed circuit board insert attached to one end of the cable. First and second electrically conductive printed circuit segments are provided on the printed circuit board insert and are connected, respectively, to the transmit and receive signal conductors. An electrically conductive shield is interposed between the transmit and receive printed circuit segments on the insert to isolate the segments from each other, whereby mutual signal interference and crosstalk between the segments at high signal frequencies is substantially reduced.

According to another aspect of the invention there is provided a novel patch cable and connector assembly for making a terminal connected patch connection into a high wiring density connector block having ground connected spring finger contacts. This novel patch cable and connector assembly includes a cable which has transmit and receive signal conductors for contacting associated conductors in a patch connector block and which also has a ground sheath surrounding the signal conductors. There is also provided a printed circuit board insert which has a ground segment thereon for contacting a grounded spring finger in the patch connector block, and a connection from the ground segment to the cable ground sheath.

According to a still further aspect of the invention there is provided a novel patch connector block and cable assembly. The patch connector block has pairs of normally contacting spring finger signal contacts arranged therein and openings in the block for admission of printed circuit board inserts to the spring finger signal contacts. The block also has pairs of spring finger ground contacts located between the signal contacts and the openings. The cable includes transmit and receive signal conductors and a ground sheath surrounding the signal conductors. There is also provided a printed circuit board insert. Each of the cable conductors is electrically connected to one of the block spring finger signal contacts. The printed circuit board insert has a ground segment thereon for contacting one of the spring finger ground contacts in the block; and the ground segment is connected to the cable ground sheath. The length of the insert is sufficient to extend from one of the openings in the block to the associated spring finger ground contacts but not sufficient to extend to the spring finger signal contacts.

BRIEF DESCRIPTION OF THE DRAWINGS

FIG. 2 is a schematic showing the electrical circuit connections involved in the patching system of FIG. 1;

FIG. 3 is a side view of a patch cable according to the present invention and used in the patching system of FIGS. 1 and 2;

FIG. 4 is an enlarged fragmentary view taken along line 4—4 of FIG. 3;

FIG. 5 is an enlarged perspective view showing a printed circuit board portion of the patch cable of FIG. 3;

FIG. 6 is an enlarged view taken along line 6—6 of FIG. 5;

FIG. 7 is a view taken along line 7—7 of FIG. 6;

FIG. 8 is a view taken along line 8—8 of FIG. 6;

FIG. 9 is a view taken along line 9—9 of FIG. 6;

FIG. 10 is a fragmentary perspective view showing the insert portion of a patch cable according to the present invention and a corresponding portion of a connector block into which the insert portion is to be inserted;

FIG. 12 is a view taken along line 12—12 of FIG. 11;

FIG. 13 is a schematic similar to FIG. 2 but showing an alternate electrical connection arrangement and associated connector block and patch cable construction according to the present invention;

FIG. 14 is a side view of a patch cable used in the arrangement of FIG. 13;

FIG. 15 is an enlarged plan view of one side of a printed circuit board portion of the patch cable of FIG. 14;

FIG. 16 is a view similar to FIG. 15 but showing the printed circuit board portion with an outer insulative layer removed;

FIG. 17 is an enlarged plan view of the opposite side of the printed circuit board portion of the patch cable of FIG. 14;

FIG. 18 is an enlarged section view taken along line 18—18 of FIG. 15;

FIG. 20 is a side view of an alternate form of patch cable according to the present invention which may be used for patching a computer terminal to a connector block;

FIG. 21 is a view similar to FIG. 13 but showing a modified form of patch cable and printed circuit board insert; and FIG. 22 is a view similar to FIG. 12 but showing the modified patch cable printed circuit board insert of FIG. 21 plugged into a patch connector block.

DETAILED DESCRIPTION OF THE PREFERRED EMBODIMENTS

Figure 1:
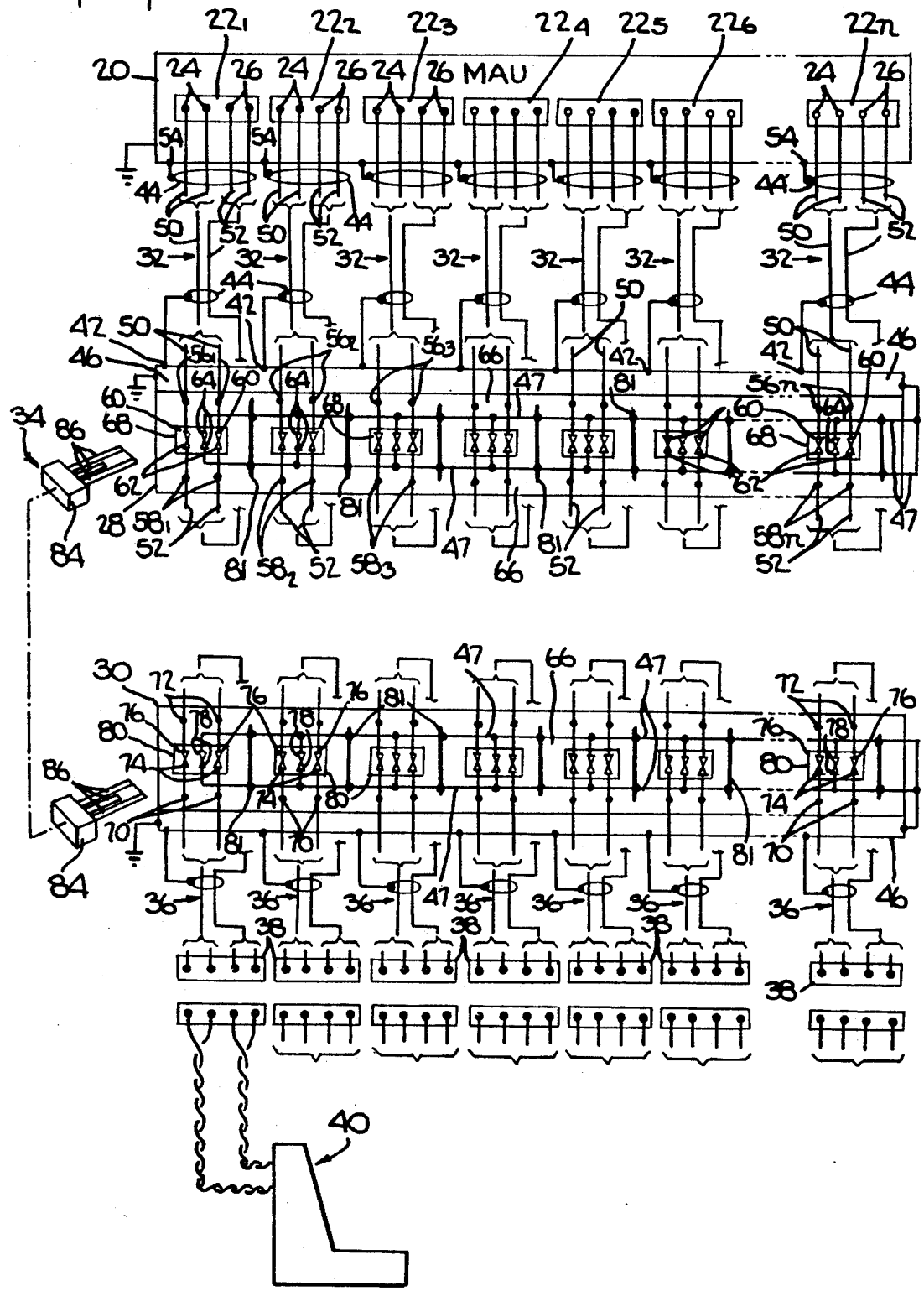
FIG. 1 is a diagrammatic representation of a cable patching system for a computer network in which the present invention is used.

As shown in FIG. 1, there is provided, at a central location in an office or building that has been prewired for computer usage, a multiple access unit (MAU) 20. The multiple access unit 20 is a central computer access station which permits computer work stations distributed throughout the office or building to be connected to a centralized computer facility; and/or to each other in a network.

The multiple access unit 20 contains several sets of terminals $22_1$, $22_2$ ... $22_n$, which may be connected, respectively, to associated computer work stations throughout the office or building. Each terminal set 22 includes a transmit terminal pair 24, from which signals are transmitted to a remote computer work station, and a receive terminal pair 26, at which signals are received from that work station. Each terminal set 22 provides for a particular class of computer service, such as word processing, accounting, inventory control, etc., or some combination thereof. By connecting a computer work station to a particular one of the terminal sets 22, that work station will be provided with a particular class of service.

The connections between the multiple access unit 20 and remote computer work stations are made through a patching system which includes first and second patch connector blocks 28 and 30 also arranged at a central location in the office or building. Multiple access unit cables 32 connect sets of multiple access unit terminals 22 to corresponding terminals of the first patch connector block 28. Patch cables 34 interconnect the first and second patch connector blocks 28 and 30; and building cables 36 connect the second patch connector block 30 to computer work station receptacles 38 distributed throughout the office or building. Computer work stations 40 may be plugged into the receptacles 38. The patch cables 34, as will be explained, can be easily connected and disconnected to any of several sets of terminals of the connector blocks 28 and 30 to thereby connect any work station receptacle 38 to any of the multiple access unit terminals $22_1$, $22_2$, ... $22_n$ of the multiple access unit 20.

The multiple access unit cables 32 each contain within an outer insulative casing, a common braided ground sheath 44 and twisted pairs of transmit and receive lines 50 and 52 within the ground sheath 44. The pairs of transmit and receive lines are twisted to minimize radiation and cross-coupling. Also, transmit and receive ground sheaths may be placed around the pairs of transmit and receive lines; and these two ground sheaths may be twisted together within the common ground sheath 44 to further minimize radiation and cross coupling.

The transmit lines 50 of each multiple access unit cable 32 are connected, respectively, to the transmit terminal pair of one of the sets of terminals 22 of the multiple access unit 20. Similarly, the receive lines 52 of the same cable 32 are connected, respectively, to the receive terminal pair of the same set of terminals 22 of the multiple access unit The common braided ground sheath 44 is connected to a ground terminal 54 on the multiple access unit 20.

The multiple access unit cable 32 is preferably provided with a multiple access unit connector plug at one end. This plug, which itself is well known, is used to connect each of the transmit lines 50 and each of the receive lines 52 as well as the braided ground sheath 44 of the cable 32 simultaneously to the respective transmit pair, the receive pair and the ground terminal 54 of one of the terminal sets 22 of the multiple access unit 20. The plug may be of the type known as an "IBM Data Connector" or a connector according to the Institute of Electrical and Electronic Engineers (IEEE) Specification No. 802.5. Other connectors, known as RJ connectors, may also be used.

The construction of the patch connector blocks 28 and 30 can be the same as given in detail in copending U.S. patent application Ser. No. 07/719,939, filed Jun. 24, 1991 and assigned to the assignee of the present invention. That description is incorporated herein by reference. It is sufficient to say however, that the patch connector blocks 28 and 30 are made of molded plastic and are generally rectangular in shape. Each block is provided with pairs of transmit terminals $56_1$, $56_2$, $56_3$ . . . $56_n$, along one side thereof and corresponding pairs of receive terminals $58_1$, $58_2$, $58_3$ . . . $58_n$, along the opposite side. Each transmit terminal 56 extends within the block to a spring finger 60 along a centerline of the block; and that spring finger normally contacts another spring finger 62 which extends from a corresponding receive terminal 58.

The transmit lines 50 of each cable 32 are connected, respectively, to associated transmit terminals 56 of the first patch connector block 28; and the receive lines 52 of the same cable are connected to the corresponding receive terminals 58 of the block 28. These connections are preferably made by the well known "push-on" technique wherein each line 50 and 52, which carries its own insulation, is forced into a thin slot in the respective connector block terminal 56 or 58. The sides of the terminal slot cut into the insulation of the line and cause its conductor to become tightly held in the slot, with positive electrical connection between the conductor and the terminal. The braided ground sheath 44 of the cable 32 is folded back at the end of the outer cable casing and an electrically conductive clamp 42 is used to fasten the cable itself to an electrically conductive shelf 46 on the block 28. The shelf in turn is in electrical contact with a pair of ground busses 47 that extend through the interior of the block.

It will be appreciated that because of the normally contacting spring fingers 62 and 64, the first patch connector block 28 normally short circuits the transmit terminal pair 24 of each terminal set 22 in the multiple access unit 20 to the receive terminal pair of the same set. This situation exists when a computer work station is not connected to a terminal set 22 of the multiple access unit 20. In such case, signals pass directly from the multiple access unit transmit terminals 24 to the associated receive terminals 26 This allows a closed loop to be maintained when a computer work station is not connected to a set of the terminals 22 of the multiple access unit. When a computer work station is connected to the terminals, the connection between the transmit terminals 24 and the receive terminals 26 is broken and the computer work station is interposed into the loop.

There is also provided in the first patch connector block 28, pairs of normally contacting grounded spring fingers 64 which are connected to the ground busses 47. Since the ground busses 47 are in contact with the shelf 46 to which the braided ground sheaths of the cables 32 are clamped, the spring fingers 64 are in electrical communication with the cable ground sheaths and with the ground terminals 54 of the multiple access unit 20. A pair of the grounded spring finger contacts 64 is located in the block 28 between the two sets of spring finger contacts 60 and 62 from each cable 32.

The patch connector block 28 is formed with patch board openings 68 along a surface 66 thereof between the rows of transmit and receiver terminals 56 and 58. Each opening 68 provides access to a pair of the spring fingers 60 and to their contacting spring fingers 62. The spring fingers 60 and 62 in each opening 68 are connected to the transmit and receive lines 50 and 52 of one of the multiple access unit cables 32. Also, since a pair of the normally contacting grounded spring finger contacts 64 is located intermediate the spring fingers 60 and 62, the opening 68 also provides access to the contacts 64.

The second patch connector block 30 is of essentially the same construction as the first patch connector block 28. Thus, the second patch connector block 30 contains pairs of transmit terminals 70 along one side thereof and corresponding pairs of receive terminals 72 along the opposite side thereof Corresponding transmit and receive terminals 70 and 72 are normally maintained in electrical contact by means of associated spring fingers 74 and 76. Also, normally closed grounded spring finger contacts 78 are interposed between the spring fingers 74 and 76. As in the case of the first patch connector block 28, the second patch connector block 30 is provided with openings 80 for patch cord printed circuit boards; and each opening 80 allows access to a set of contacting spring fingers 74 and 76 from a pair of transmit terminals 70 and a pair of receive terminals 72 as well as an intermediate set of grounded spring finger contacts 78.

Each of the patch connector blocks 28 and 30 is provided with a plurality of electrically conductive shields 81 which extend transversely inside the blocks between each of the openings 68 in the first block 28 and between each of the openings 80 in the second block 30. These shields are in the form of thin plates and are shaped to extend between adjacent sets of terminals 56,58 and 70,72 and their associated spring fingers 60,62 and 74,76. The shields 81 make contact inside the blocks with the ground busses 47 and thus provide a grounded shield between adjacent sets of spring fingers and associated terminals.

The building cables 36, which are of the same construction as the above described multiple access unit cables 32, interconnect respective computer work station receptacles 38 and corresponding sets of transmit and receive terminals 70 and 72 of the second patch connector block 30. The building cables 36 are connected to the second patch connector block in the same manner as employed to connect the multiple access unit cables 32 to the first connector block 28. Also, the manner in which the opposite ends of the building cables 36 are connected to the respective computer work station receptacles 38 is conventional and not part of this invention.

The patch cables 34 are of the same general construction as the multiple access unit cables 32 and the building cables 36, except that the ends of the patch cables 34 are provided with printed circuit board inserts 84 which are configured to fit into the openings 68 and 80 of the patch connector blocks 28 and 30 respectively. As will be described in further detail hereinafter, the printed circuit board inserts 84, when inserted into the openings 68 and 80 of the patch connector blocks 28 and 30, force apart the normally contacting spring fingers inside those openings to break their electrical connection. In addition, the printed circuit board inserts 84 have contact elements 86 which, when the board is inserted, make contact with the now separated spring finger contacts. The contact elements 84 are electrically connected to electrical lines within the cable 34 and these connections will be described more fully hereinafter.

Although only one patch cable 34 is shown in FIG. 1, there are actually several such cables; and each cable interconnects the spring finger contacts inside an opening 68 of the first connector block 28 with the spring finger contacts inside of an opening of the second connector block 30. In this way, by simply plugging the ends of the patch cables 34 into the openings of the patch connector blocks 28 and 30 any computer work station receptacle 38 throughout an office or building can be connected with any set of terminals 22 in the multiple access unit 20. This rearrangement of connections can be made without any movement or rewiring of the multiple access unit cables 32 or the building cables 36.

FIG. 2 shows in schematic, the wiring interconnection between a terminal set 22 of the multiple access unit 20 and a computer work station receptacle 38 which is permanently mounted in a wall 88 of a building, for connection with a computer work station 40. As can be seen in FIG. 2, a given terminal set 22 of the multiple access unit 20 is connected via the patch connector blocks 28 and 30 to a particular computer work station receptacle 38.

The patch cable 34, as shown in FIG. 2, includes a pair of transmit lines 94 and a pair of receive lines 98 surrounded by a common braided ground sheath 102. Individual ground sheaths (not shown) may also surround each pair of transmit and receive lines inside the ground sheath 102. Each end of the patch cable 34 is connected to a printed circuit board insert 84. The two printed circuit board inserts are shown (schematically) in their inserted position in the patch blocks 28 and 30, respectively. As can be seen, the insert 84 at one end of the cable 34 extends between and separates the normally contacting spring finger contacts 60, 62 and 64 of the first block 28 and the insert 84 at the other end of the cable 34 extends between and separates the normally contacting spring finger contacts 74, 76 and 78 at the second block 30.

Each printed circuit board insert 84 has a central, electrically conductive shield layer 104 with insulative portions 106 and 107 on opposite sides thereof. The contact elements 86 on the outer surfaces of the insulative portions 106 and 107 include transmit line contact elements $86_a$ and $86_b$ and a ground contact element $86_c$ on one side and receive line contact elements $86_d$ and $86_e$ and a ground contact element $86_f$ on the opposite side. The transmit line contact elements $86_a$ and $86_b$ of the printed circuit board insert 84 at one end of the cable 34 touch the spring fingers 60 in the first block 28 while the receive line contact elements $86_d$ and $86_e$ touch the spring fingers 62 of the first block. The ground contact elements $86_c$ and $86_f$ touch the grounded spring fingers 64 of the first block 28. Similarly, the transmit line contact elements $86_a$ and $86_b$ of the printed circuit board insert 84 at the other end of the cable 34 touch the spring fingers 76 in the second block 30 while the receive line contact elements $86_d$ and $86_e$ touch the spring fingers 74 of the second block. The ground contact elements $86_c$ and $86_f$ touch the grounded spring fingers 78 of the second block 30.

As shown schematically in FIG. 2, and as will be described in greater detail hereinafter, the transmit line contact elements $86_a$ and $86_b$ of each printed circuit board insert 84 are connected to the transmit lines 94 of the patch cable 34 and the receive line contact elements $86_d$ and $86_e$ of the printed circuit board inserts are connected to the receive lines 98 of the patch cable 34. Also, the electrically conductive shield layer 104, which is connected to the ground contact elements $86_c$ and $86_f$, is connected to the common braided ground sheath 102 of the patch cable 34.

FIG. 3 shows an overall view of one of the patch cables 34. As can be seen in FIG. 3 the printed circuit board inserts 84 are mounted to the ends of the cable 34 by means of molded plastic housings 108. These housings are formed in two parts which are clamped over the ends of the cable 34 and are held together at welded posts 110.

As shown in the enlarged section view of FIG. 4, the cable 34 has an outer sheath 112 which is terminated to expose a length of the braided ground sheath 102. The exposed ground sheath is folded back and a metal clamp 114 is clamped around the folded back portion of the ground sheath 102. The clamp is formed with flanges 116 which are held in recesses 118 in the housings 108. A ground wire 120 extends out from the clamp 114 and along the transmit and receive lines 94 and 98. The transmit and receive lines 94 and 98, extend beyond the folded back braided ground sheath.

As can be see in FIGS. 5 and 6, the printed circuit board insert 84 is of elongated rectangular shape and comprises a laminate formed of the electrically conductive shield layer 104 sandwiched between the insulative portions 106 and 107. The shield layer 104 is a thin plate of copper or other highly conductive material. The insulative portions 106 and 107 are conventional printed circuit board base material. The shield layer 104 extends over the entire lateral area of the insulative portions 106 and 107.

The printed circuit board insert 84 is formed with an elongated insert portion 122 at one end and a rectangular cable connection portion 124 at the other end. The insert and cable connection portions 122 and 124 are separated by a narrower neck portion 126. The insert portion 122 is formed with a taper 128 at its tip to facilitate insertion of the board between normally contacting spring fingers in the blocks 28 and 30.

A pair of parallel, spaced apart, electrically conductive transmit line segments 130 and 132 are formed, by conventional printed circuit plating technique, along the outer surface of the insulative portion 106. As can be seen in FIG. 7, the segments 130 and 132 extend from a location near the taper 128 on the insert portion 122, through the neck portion 126 and to transmit line cable connector terminals 134 and 136 near one edge of the cable connection portion 124. The cable connector terminals are formed by drilling holes through the printed circuit board insert 84 and metal plating the interior of the holes with the plating in contact with the respective line segment 130 and 132. This enables a wire to be connected to the line segment by passing the wire through the plated hole and then soldering it in place.

A ground segment 138 is also formed by conventional printed circuit plating technique on the insert portion 122 between the line segments 130 and 132. A plated through hole 140 is formed in the ground segment and electrically connects the ground segment to the shield layer 104.

As shown in FIGS. 5 and 6, a thin insulative protective layer 142 covers the outer surface of the insulative layer 106 and the transmit line and ground segments 130, 132 and 138. The layer 142 is formed with openings in selected regions over the segments 130, 132 and 138 whereby those regions form the contact elements 86 which are contacted by the spring fingers of the patch connector blocks 28 and 30.

Turning now to FIG. 8 it will be seen that the electrically conductive shield layer 104 extends over the entire lateral area of the cable connection and neck portions 124 and 126 of the insert 84. Thus the layer 104 fully shields the transmit line segments 130 and 132. Also, the shield layer 104 extends over the ground segment 138 and becomes electrically connected to the ground segment via the plated through hole 140. It will also be noted that the shield layer 104 is necked down, as shown at 144 in the rectangular cable connection portion 124, so that it does not contact the plated through holes which form the transmit cable connector terminals 134 and 136. Thus the transmit line segments 130 and 132 are electrically isolated from the shield portion 104.

As shown in FIGS. 6 and 9, a pair of parallel, spaced apart, electrically conductive receive line segments 146 and 148, similar to the transmit line segments 130 and 132, are formed along the outer surface of the insulative portion 107. As can be seen in FIG. 9, the segments 146 and 148 extend over the same regions of the insert and neck portions 122 and 126 as the transmit line segments 130 and 132. In the cable connection portion 124 however, the receive line segments 146 and 148 extend to receive line cable connector terminals 150 and 152 which are located along an opposite edge from where the transmit line cable connector terminals 134 and 136 are located. Further, because of the necked down portion 144 of the shield layer 104, the receive line cable terminals 150 and 152 do not contact the shield layer.

A fifth plated through connector terminal 154 is provided centrally of the end edge of the rectangular cable connection portion 124. This connector terminal contacts the shield layer 104 and permits the ground wire 120 (FIG. 4) to be connected to the shield layer.

A ground segment 156, similar to the ground segment 138 is formed on the outer surface of the insulative portion 107 and is connected to the shield layer 104 via the plated through hole 140.

A thin insulative protective layer 158 (FIG. 6), similar to the layer 142, covers the outer surface of the insulative layer 107 and the receive line and ground segments 146, 148 and 156. The layer 142 is also formed with openings in selected regions over the segments 146, 148 and 156 to form the contact elements 86 which are contacted by the spring fingers of the patch connector blocks 28 and 30.

FIG. 10 shows the positional relationships of the electrically conductive elements of the connector block 28 and the printed circuit board insert 84. As can be seen, the terminals 58 and their associated spring fingers 62 are each integrally formed from a thin strip of metal, with the spring fingers 62 bent inwardly toward the center of the block and the terminals 58 extending upwardly along the side of the block and then bent back downwardly to form an inverted U-shape. Vertical slots 58a are formed in the base of the U-shape part of the terminals to receive the lines 52 from the cables 32 (FIG. 1) which are placed across the slots and then punched down into the slots. During this punching operation, the sides of the slots cut away the insulation from the lines and press into the conductive portion of the lines to make positive electrical connection. The spring fingers 60 (not shown in FIG. 10) are formed together with their respective terminals 56 in the same manner.

It will be appreciated that the ground busses 47 extend along the length of the block 28 between the terminals 56 and 58 and a short distance above the spring fingers 62 and 64. The grounded spring fingers 64 are formed integrally on the busses 47. The busses 47 are connected at the end of the block to the electrically conductive shelf 46 (FIG. 1). Also, as shown in FIG. 10, flanges 47a extend downwardly from the busses 47 and make contact with the shields 81.

Figure 11:
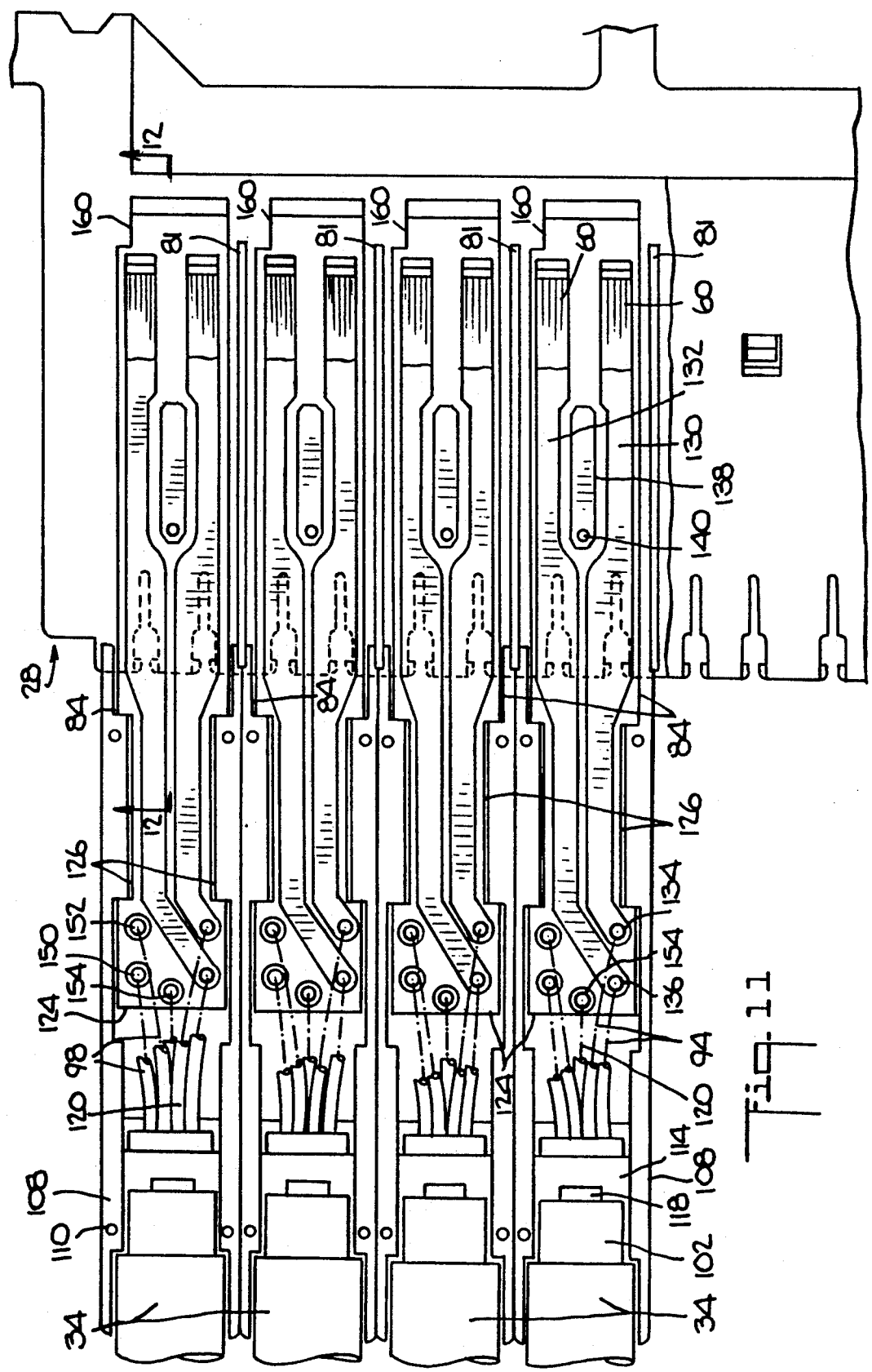
FIG. 11 is an enlarged sectional view showing a plurality of patch cables according to FIGS. 1-10 plugged in to a patch connector block.

FIG. 11 shows, in cutaway, four patch cables 34 with their printed circuit board inserts 84 inserted in the patch connector block 28. As can be seen, the shape of the inserts 84, with their narrow neck portion 126 and their rectangular cable connection portion 124, permits them to be securely fitted into the molded plastic housings 108 and held therein together with the ends of the patch cables 34. The transmit lines 94 of the patch cables 34 are soldered or otherwise connected to the transmit line cable connector terminals 134 and 136 and the receive lines 98 of the cables 34 are soldered or otherwise connected to the receive line connector terminals 150 and 152. Thus the transmit lines 94 of the patch cables 34 are connected to the transmit line segments 130 and 132 on the shown side of the printed circuit board inserts 84 and the receiver lines 98 are connected to the receive line segments 146 and 148 on the not shown opposite side of the inserts. Also, the ground wire 120 from the common braided ground sheath 44 is connected to the electrically conductive shield layer 104 as well as to the ground segments 138 and 156 on the opposite sides of the printed circuit board inserts.

The printed circuit board inserts 84 are formed with notches 160 at one corner of their outer end. These notches accommodate shoulders (not shown) in the blocks 28 and 30 to allow full insertion of the inserts only when they are facing in the proper direction. If the inserts are reversed so that their receive line segments 146 and 148 are facing outwardly, the notches 160 will also be reversed and the shoulders in the blocks 28 and 30 will prevent full insertion of the inserts 84.

As shown in FIG. 12, when the printed circuit board insert 84 is fully inserted into the opening 68 in the first patch connector block 28, it spreads apart and breaks the electrical connection between the spring fingers 60 and 62 from the block transmit and receive terminals and also spreads apart and breaks the electrical connection between the grounded spring finger contacts 64. In addition, when the printed circuit board insert 84 is fully inserted into the block 28, its contact elements 86 make electrical contact with the spread apart spring fingers. In this manner the circuit connections shown in FIG. 2 are established. It will be appreciated that when the insert 84 is withdrawn, the spring fingers 60 and 62 again come into contact with each other to reestablish electrical contact between the transmit and receive lines 50 and 52 of the multiple access unit cable 32. Similarly, the spring fingers 64 come back into mutual contact to ensure the integrity of the ground system.

The present invention serves to prevent high frequency signals on the spring fingers 60 or 74 from interfering with the signals on the separated spring fingers 62 or 76 when a printed circuit board insert 84 is inserted in the patch block 28 or 30. This is achieved, according to the present invention, by the provision of the electrically conductive shield layer 104 between the transmit line segments 130, 132 and the receive line segments 146, 148 of the printed circuit board inserts 84. Before an insert 84 is inserted, the spring fingers 60 contact the spring fingers 62 in the first block 28 and the spring fingers 74 contact the spring fingers 76 in the second block 30. In this condition the contacting spring fingers have the same signal on them at all times and they need no electrical isolation. However, when a patch cable 34 is connected, as by inserting its printed circuit board inserts into the connector blocks 28 and 30, the now separated spring fingers are connected to different terminals of a computer work station and they carry different signals. Accordingly it then becomes necessary to provide isolation between the now separated spring fingers This is achieved in the present invention by the electrically conductive shield layers 104 in the printed circuit board inserts. These conductive shield layers prevent any radiative or inductive coupling between the separated spring fingers.

The present invention also serves to maintain a continuous ground connection from each set of terminals 22 in the multiple access unit 20 to the respective computer work station receptacles 38 to which the terminals are connected. This continuous ground connection is made through the ground sheaths 44 of the patch cables 34 and the ground segments 138 on their respective printed circuit board inserts 84 as well as the grounded spring finger contacts 64 and 78 of the patch connector blocks 28 and 30.

The manner in which the printed circuit board insert 84 at the other end of the patch cables 34 establishes connection in the second patch connector block 30 with the corresponding transmit, receive and ground lines of the building cables 36 is exactly the same as described above for the first patch connector block 28.

FIG. 13 shows an alternative patch connector block 28a and printed circuit board arrangement for making the same connections as described above. The physical construction of the block 28a is the same as the block 28 in the preceding embodiment; however different reference numerals are used to identify the various terminals and spring fingers. In the arrangement of FIG. 13, the transmit lines 50 of the multiple access unit cable 32 are connected, preferably by push on connections as above described, to transmit line terminals 164 and 166 on one side of the patch connector block 28a and the receive lines 52 are connected in the same manner to receive line terminals 168 and 170 on the same side of the block. The braided ground sheath 44 is connected to a common bus 172 in the block as described in connection with the first embodiment. Also as described the common bus 172 is in electrical contact within the block 28a with the grounded spring finger contacts 64. The transmit line terminals 164 and 166 have associated transmit line spring fingers 174 and 176 and the receive line terminals 168 and 170 have associated receive line spring fingers 178 and 180. Each of the spring fingers 172, 174, 176 and 178 is normally in contact with a corresponding spring finger 182, 184, 186 and 188 on the opposite side of the block 28 and these spring fingers have associated terminals 190, 192, 194 and 196. The terminals 190 and 194 are connected by a first wire 198 and the terminals 192 and 196 are connected by a second wire 200. These last mentioned connections are also preferably made by the above described push on technique.

It will be appreciated that when the spring fingers 174, 176, 178 and 180 are in contact with their corresponding spring fingers 182, 184, 186 and 188 (as when the patch cable printed circuit board insert is removed) the first and second wires 198 and 200 effectively connect the transmit lines 50 of the multiple access unit cable 32 with the receive lines 52 of the same cable.

The arrangement of terminals, spring fingers and connecting wires on the second patch connector block 30a is the same as described above for the first block and that description will not be repeated.

As shown schematically in FIG. 13 a patch cable 34a (which is of similar construction to the patch cable 34) is provided at each end with a printed circuit board insert 202 which comprises a two layer laminate made up of an electrically conductive layer 204 and an insulative printed circuit board layer 206. In the region where the insert 202 makes contact inside the block 28a the insert is formed as two tongues 202A and 202B which can be inserted, respectively into adjacent ones of the openings 68 in the block 28a. The outer surface of the printed circuit board layer 206 is provided with electrically conductive transmit segments 208 and 210 as well as electrically conductive receive segments 212 and 214. These segments make contact with the transmit and receive spring fingers 174, 176 and 178, 180 when the insert 202 is fully inserted into the block 28a as indicated in FIG. 13. At the same time, the electrically conductive layer 204 makes contact with the spring fingers 182, 184, 186 and 188.

Also as shown schematically in FIG. 13 the transmit segments 208 and 210 are connected to the transmit lines 94 of the patch cable 34a and the receive segments 212 and 214 are connected to the receive lines 98 of the patch cable. Also, the common braided ground sheath 102 of the patch cable 34a is connected to the electrically conductive layer 204.

Electrically conductive shield elements 216, 218, 220 and 222 are formed on the surface of the insulative layer 206 of the printed circuit board insert 202 along opposite edges respectively of the two tongues 202A and 202B. These shield elements are each connected through the insulative layer 206 to the electrically conductive layer 204. The shield elements 216, 218, 220 and 222 serve to shield the transmit segments 208 and 210 from the receive segments 212 and 214 and vice versa when the printed circuit board insert 202 is inserted into the connection block 28a.

A similar printed circuit board insert 203 with the above described construction is provided at the other end of the cable 34a for patching connection with the second block 30a. As in the preceding embodiment, the second block 30a is connected to the building cable 36. Reference numerals are omitted from the showing of this last mentioned printed circuit board insert for purposes of clarity of illustration. However the same reference numerals apply to corresponding elements in both inserts.

FIG. 14 shows an overall view of a patch cable 34a. As can be seen in FIG. 14, the printed circuit board inserts 202 and 203 are mounted to the ends of the cable 34a by means of molded plastic housings 216 of similar construction to the housings 108. These housings are formed in two parts which are clamped over an outer cable sheath and are held together at welded posts 110.

FIGS. 15-18 show the details of the construction of the printed circuit board inserts 202 and 203. The two printed circuit board inserts 202 and 203 are of the same construction and only the insert 202 will be described in detail. As shown in FIG. 18, the printed circuit board insert 202 is formed of a laminate which includes the electrically conductive layer 204 and the insulative printed circuit board layer 206. As shown in FIGS. 15-17, the insert 202 is shaped with two tongues 202A and 202B which fit into adjacent openings 68 or 80 in one of the patch connector blocks 28a and 30a. FIG. 16 shows the transmit segments 208 and 210 on the outer surface of the printed circuit board layer 206. These segments extend parallel to each other along the tongue 202A from an insertion end 216 of the printed circuit board insert 202 to a cable connection region 224 at the opposite end of the board. The receive segments 212 and 214 are similarly placed on the tongue 202B.

As shown in FIG. 16, the segments 208, 210, 212 and 214 each have widened regions along a first length (a) near the insertion end 216 for positive contact with the spring fingers 174, 176, 178 and 180 in the block 28. Also spaces 226 of similar width are maintained between the widened regions along the length (a) to avoid contact with the grounded spring fingers 64. The segments 208, 210, 212 and 214 are narrowed in regions along a second length (b) beyond the first length (a) to increase their separation and electrical isolation from each other and from corresponding segments of adjacent printed circuit boards 202. In the regions along the length (b) however, the width of the spaces 226 is maintained to avoid contact with the grounded spring fingers 64. In further regions along a third length (c), beyond the regions along the length (b), the segments 208 and 210 are located closer to each other to further enhance electrical isolation from adjacent segments. Similarly, the segments 212 and 214 are also located closer to each other in the regions along the third length (c).

The segments 208, 210, 212 and 214 each terminate at the cable connection region 224 of the board 202. Cable connectors 228 in the form of plated through holes are formed at the end of each segment 208, 210, 212 and 214 in the cable connection region 218 for connection to the transmit and receive lines 94 and 98 of the patch cable 34a.

A central ground shield printed circuit segment 230 extends from a ground shield cable connector 232 at the cable connection region 224 to the two tongues 202A and 202B where it forms the segments 218 and 220 respectively. The segments 218 and 220 extend along the inner edge of each tongue alongside the second and third lengths (b) and (c) of the transmit segment 210 and of the receive segment 212. In addition, the outer ground shield printed circuit segments 216 and 222 extend along the outer edges of the insert 202 adjacent the regions second and third lengths (b) and (c) of the transmit segment 208 and of the receive segment 214. These outer ground shield segments 216 and 222 are connected by plated through holes 234 to the electrically conductive layer 204 on the opposite side of the insert 202. As can be seen in FIG. 17, the electrically conductive layer 204 extends laterally over the entire area of the insert 202 except that in the cable connection region 224, the electrically conductive layer 204 is formed with a neck 236 so that it is electrically isolated from the cable connectors 228 but is electrically connected to the central ground shield segment 230 through the ground shield cable connector 232.

Thin protective coatings 236 and 238 are formed over the outer surface on opposite sides of the insert 202. The coating 234 covers the printed circuit segments 208, 210, 212, 214, 224 and 228 on one side of the insert and the coating 236 covers the electrically conductive layer 204 on the other side of the insert. Openings are provided in the protective coating 236 on the one side to expose contact regions 208a, 210a, 212a and 214a of the transmit and receive segments so that they can be electrically contacted by the spring fingers 174, 176, 178 and 180 (FIG. 13) of the block 28a when the insert 202 is fully inserted into the block. Also, openings are provided in the protective coating 238 on the other side to expose contact regions 204a of the electrically conductive layer 204 so that it can be contacted by the grounded spring fingers 64 of the block 28a.

Figure 19:
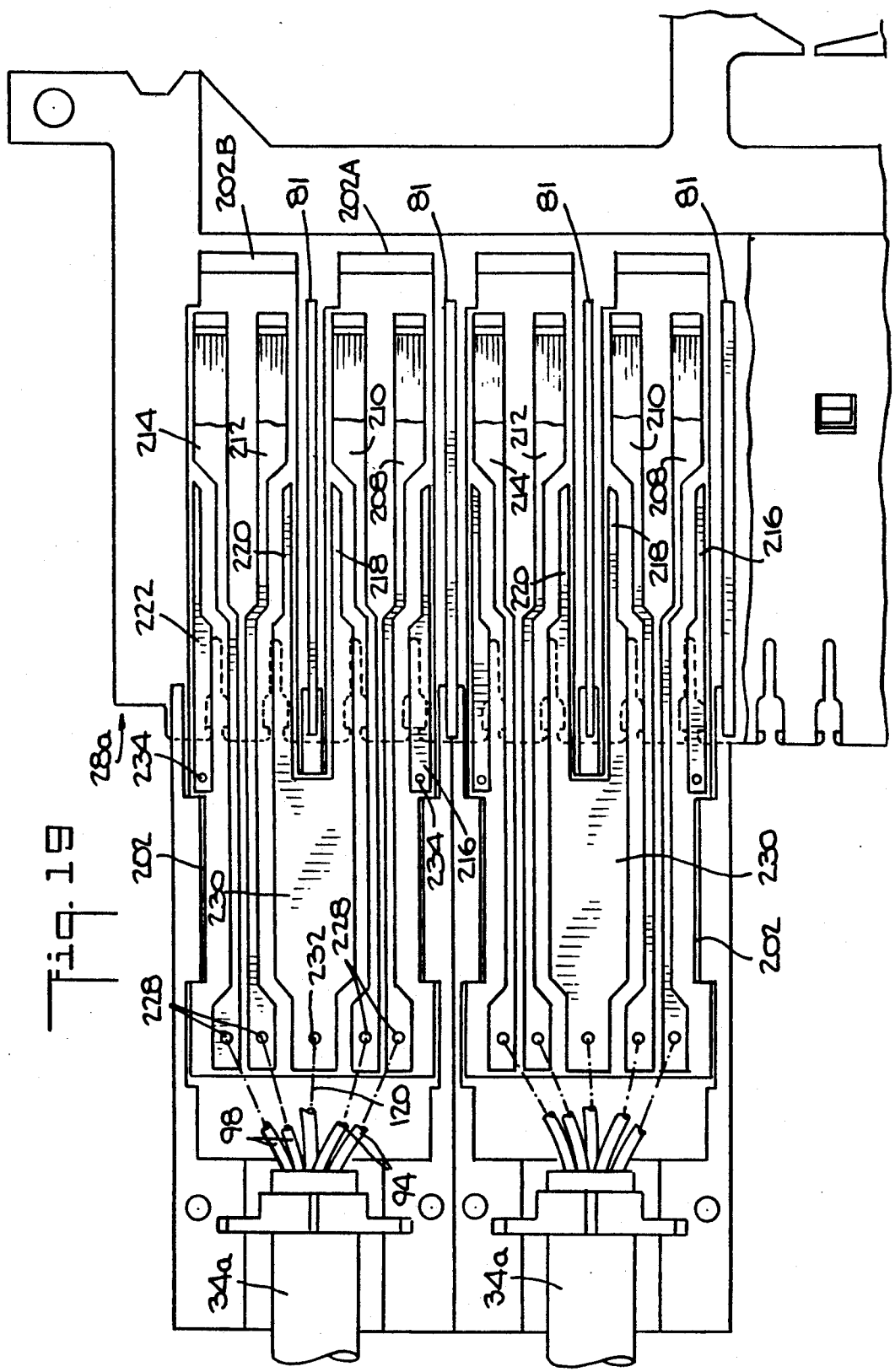
FIG. 19 is an enlarged sectional view showing a plurality of patch cables according to FIGS. 13-18 plugged in to a patch connector block.

As shown in FIG. 19, when patch cables 34a are inserted in side by side relation into the patch connector block 28a or 30a, the inner ground shield printed circuit segments 218 and 220 are interposed between adjacent transmit and receive segments 210 and 212. These printed circuit segments, even though they have minimal thickness, nevertheless are at least as thick as the transmit and receive segments; and are effective in significantly isolating those segments from mutual interference at high frequencies. Specifically, it has been found that so long as the electrically conductive shield segments 218 and 220 occupy the projected area between the transmit and receive segments 210 and 212 they will be effective to significantly reduce interference and crosstalk between those segments.

It will be noted that the outer shield segments 216 and 222 extend only in the regions corresponding to the second and third lengths (b) and (c) of the transmit and receive segments, and not in the region corresponding to the first length (a). It is not necessary that the outer shield segments 216 and 222 extend into the region of the first length (a) because, as shown in FIG. 19, the electrically conductive block shield plates 81, which are provided in the blocks 28a and 30a, extend into that region. Although, as shown in FIG. 19, a portion of each shield plate 81 is shown as extending up as far as the regions corresponding to the lengths (b) and (c) of the printed circuit board insert 202, that portion of the shield plate does not extend between and does not shield adjacent transmit and receive segments of the printed circuit board insert 202. Instead, in the regions corresponding to the lengths (b) and (c), the shield plate 238 straddles the transmit and receive segments 208, 210, 212 and 214. This can be appreciated by reference to FIG. 10 which shows the same configuration as the block 28a, the shields 81 and the various terminals and spring fingers. However isolation is maintained in spite of this because of the effect of the ground shield segments 224 and 228 on the printed circuit board inserts 202.

FIG. 20 shows an alternate form of a patch cable 34b which has a printed circuit board insert 240 on one end and an IBM type connector 242 at the other end. Such a configuration is useful in arrangements where only one patch connector block is provided and it is desired to make connections from a computer terminal which receives an IBM type connector, to a patch connector block.

In the above described embodiments, the printed circuit board inserts 84 at the ends of the patch cables 34 and 34a included not only ground connection segments but also transmit and receive segments so that upon insertion of the insert into one of the blocks 28 or 30 all connections for a particular set of terminals is made simultaneously. Also, the use of printed circuit board inserts, which make all connections simultaneously, permits quick and convenient repatching without need for any tools. The patch cables 34 and 34a are connected simply by inserting their printed circuit board inserts 84 and 202 into appropriate openings 68 and 80 of the blocks 28, 30 and 28a, 30a.

In some situations it is preferred to provide a more secure patching arrangement than one made by simply plugging printed circuit board inserts into connector blocks. The arrangement of FIGS. 21 and 22 permits such secure patching. At the same time this arrangement maintains a continuous ground connection between the multiple access unit and the remote computer work stations.

The arrangement of FIG. 21 includes the first and second patch connector blocks 28a and 30a with multiple access unit and building cables 32 and 36 connected thereto as described above in connection with FIG. 13. In the arrangement of FIG. 21 however, the patch connector blocks 28a and 30a are interconnected by patch connector cables 34c having printed circuit board inserts 250 which are different from the inserts 84 and 202 of the cables 34, 34a and 34b. More specifically, as shown in FIG. 21, the inserts 250 each have a single ground segment 252. The ground segment is connected by a ground wire 254 to a clip 256 which in turn is attached to the braided ground sheath 102 near the end of the cable 34c. The transmit and receive lines 94 and 98 of the cable 34c extend from the ends of the cable beyond the ground sheath 102 and are directly connected to the associated terminals 190, 192, 194 and 196 of the blocks 28a and 30a. These direct connections are made in the same manner as in the case of the transmit and receive lines 50 and 52 of the multiple access unit cables 32 and the corresponding transmit and receive lines of the building cables 36. That is, they are punched down into the respective terminals of the patch connector blocks. This provides a very secure connection which is not easily pulled out; and, moreover, the electrical connections between the lines and the terminals is positive and highly reliable.

It will be appreciated that in the embodiment of FIG. 21, the electrical connections from the transmit and receive lines 50 and 52 to their counterpart transmit and receive lines 94 and 98 of the patch cable 34c are made through the associated terminals and their closed or contacting fingers in the block 28a; and similar electrical connections are made in the block 30a. However, the ground connections are made via the ground segments 252 of the inserts 250 which enter between and contact the ground terminals 64 in the blocks 28a and 30a.

As shown in FIG. 22, the inserts 250 of the patch cables 34b are shorter than the inserts 84 and 202 of the preceding embodiments. Accordingly, when the inserts 250 are plugged into the blocks 28a and 30a, they extend to and contact the ground fingers 64 but they do not reach the fingers 174 and 182 which are connected to the transmit lines 50 and 94, nor do they reach any of the other fingers that are connected to transmit or receive lines. Accordingly, those fingers all remain in contact so that transmit and receive signals may be transmitted through the block.

It will be appreciated that the invention described herein provides simple and convenient patching between multiple access unit terminals and building terminals while maintaining good isolation between terminals and contacts in the patch connection blocks and continuous shielding ground connections through the blocks from the multiple access unit terminals and the building terminals.

I claim:

1. A patch cable and connector assembly for making a patch connection into a high wiring density connector block having separable spring finger contacts, said assembly comprising a cable containing transmit and receive signal conductors, a circuit board insert attached to one end of said cable, first and second electrically conductive circuit segments on said circuit board insert and connected, respectively, to said transmit and receive signal conductors and an electrically conductive shield interposed between said first and second circuit segments on said insert to isolate said segments from each other whereby mutual signal interference and crosstalk between said segments at high signal frequencies is substantially reduced.

2. A patch cable and connector assembly according to claim 1 wherein said electrically conductive shield occupies at least the projected area between said transmit and receive segments.

3. A patch cable and connector assembly according to claim 1 wherein said electrically conductive shield is electrically connected to ground.

4. A patch cable and connector assembly according to claim 3 wherein said cable includes an electrically conductive ground sheath along its length and wherein said electrically conductive shield is connected to said ground sheath.

5. A patch cable and connector assembly according to claim 1 wherein said transmit and receive signal conductors comprise a first pair of twisted together transmit signal conductors and a second pair of twisted together receive signal conductors.

6. A patch cable and connector assembly according to claim 5 wherein said transmit signal conductors are connected to the conductive segments on one side of said insert and said receive signal conductors are connected to the conductive segments on the other side of said insert.

7. A patch cable and connector assembly according to claim 6 wherein said cable includes an electrically conductive ground sheath along its length and wherein said electrically conductive layer is connected to said ground sheath.

8. A patch cable and connector assembly according to claim 1 wherein said circuit board insert is a laminate which includes an electrically conductive central layer and outer circuit board layers on opposite sides of said central layer, said central layer comprising said shield and said conductive segments being located on the outer surfaces of said circuit board layers.

9. A patch cable and connector assembly according to claim 8 wherein said circuit board insert has a cable connecting region at one end which is provided with spaced apart connections between each of said transmit and receive signal conductors and associated ones of said circuit segments 10. A patch cable and connector assembly according to claim 8 wherein said central layer occupies substantially the entire lateral extent of said insert.

11. A patch cable and connector assembly according to claim 8 wherein said circuit board insert has a cable connecting region at one end which is provided with spaced apart connections between each of said transmit and receive signal conductors and associated ones of said circuit segments and between said ground sheath and said central layer.

12. A patch cable and connector assembly according to claim 11 wherein said central layer is narrowed in said cable connecting region to avoid contact with the connections to said transmit and receive signal conductors.

13. A patch cable and connector assembly according to claim 6 wherein a further electrically conductive segment is formed on the outer surface of at least one of said circuit board layers for contact by a ground connected spring finger and wherein said further electrically conductive segment is electrically connected to said electrically conductive layer.

14. A patch cable and connector assembly according to claim 13 wherein said further electrically conductive segment is electrically connected to said electrically conductive layer via a plated through hole in said circuit board insert.

15. A patch cable and connector assembly according to claim 1 wherein said first and second circuit segments are formed on the same side of said circuit board insert and wherein said electrically conductive shield comprises at least one further electrically conductive circuit segment extending between said first and second segments.

16. A patch cable and connector assembly according to claim 15 wherein said insert includes further electrically conductive shields on the same side of said insert as said first and second segments but on the opposite sides of said segments from the first electrically conductive shield.

17. A patch cable and connector assembly according to claim 15 wherein said electrically conductive shield is electrically connected to ground.

18. A patch cable and connector assembly according to claim 15 wherein said cable includes an electrically conductive ground sheath along its length and wherein said electrically conductive shield is connected to said ground sheath.

19. A patch cable and connector assembly according to claim 15 wherein said circuit board insert has a cable connecting region at one end which is provided with spaced apart connections between each of said transmit and receive signal conductors and associated ones of said circuit segments.

20. A patch cable and connector assembly according to claim 15 wherein said circuit board insert includes an electrically conductive ground segment on a side thereof opposite said circuit segments for contact by a ground connected spring finger.

21. A patch cable and connector assembly according to claim 20 wherein said electrically conductive ground segment is formed as a region of an electrically conductive layer on said insert.

22. A patch cable and connector assembly according to claim 21 wherein said electrically conductive layer is electrically connected to said further electrically conductive segment via a plated through hole in said insert.

23. A patch cable and connector assembly according to claim 22 wherein said cable includes an electrically conductive ground sheath along its length and wherein said electrically conductive layer is electrically connected to said ground sheath via a connection at said cable connecting region.

24. A patch cable and connector assembly according to claim 22 wherein further electrically conductive shields are provided on the same side of said insert as said first and second segments but on opposite sides of said segments from said first electrically conductive shield and wherein said further electrically conductive shields are connected to said electrically conductive ground layer.

25. A patch cable and connector assembly according to claim 15 wherein said cable includes a pair of transmit lines and a pair of receive lines and wherein said circuit segments formed on the same side of said circuit board insert include a pair of transmit segments and a pair of receive segments.

26. A patch cable and connector assembly according to claim 25 wherein said circuit board insert is formed with a pair of tongues, with said transmit segments extending along one tongue and said receive segments extending along the other tongue 27. A patch cable and connector assembly according to claim 26 wherein said electrically conductive shield includes two portions which extend, respectively, along each of said tongues.

28. A patch cable and connector assembly for making a patch connection into a high wiring density connector block having ground connected spring finger contacts, said assembly comprising a cable which includes transmit and receive signal conductors for contacting associated conductors in a patch connector block, a ground sheath surrounding said signal conductors, a circuit board insert, said circuit board insert having a ground segment thereon for contacting a grounded spring finger in said patch connector block and said ground segment being connected to said ground sheath.

29. A patch connector block and cable assembly comprising a patch connector block having pairs of normally contacting spring finger signal contacts arranged therein and openings in said block for admission of printed circuit board inserts to said spring finger signal contacts, said block further having pairs of spring finger ground contacts located between said signal contacts and said openings, a cable which includes transmit and receive signal conductors, each conductor being connected to one of said spring finger signal contacts, a ground sheath surrounding said signal conductors of said cable and a printed circuit board insert, said printed circuit board insert having a ground segment thereon for contacting one of said spring finger ground contacts, said ground segment being connected to said ground sheath, the length of said insert being sufficient to extend from one of said openings to the associated spring finger ground contacts but not sufficient to extend to said spring finger signal contacts.

* * * * *

UNITED STATES PATENT AND TRADEMARK OFFICE
CERTIFICATE OF CORRECTION

PATENT NO. : 5,205,762
DATED : April 27, 1993
INVENTOR(S) : WILLIAM V. CARNEY

It is certified that error appears in the above-identified patent and that said Letters Patent is hereby corrected as shown below:

TITLE PAGE

AT [56] REFERENCES CITED

U.S. Patent Documents,
    "Heinz Piorunneck" should read --Piorunneck--.

COLUMN 1

Line 42, "finger" should read --fingers--.

COLUMN 4

Line 53, "unit The" should read --unit. The--.

COLUMN 6

Line 12, "thereof Corresponding" should read --thereof. Corresponding--.
    Line 63, "elements 84" should read --elements 86--.

COLUMN 7

Line 44, "elements 86a" should read --elements $86_a$--.
    Line 48, "elements 86c and 86f" should read --elements $86_c$ and $86_f$--.
    Line 51, "86b" should read --$86_b$--.
    Line 56, "$86_f$touch" should read --$86_f$ touch--.

COLUMN 8

Line 49, "segment 130" should read --segments 130--.
    Line 66, "FIG. 8" should read --FIG. 8,--.

UNITED STATES PATENT AND TRADEMARK OFFICE
CERTIFICATE OF CORRECTION

PATENT NO. : 5,205,762
DATED : April 27, 1993
INVENTOR(S) : WILLIAM V. CARNEY

It is certified that error appears in the above-identified patent and that said Letters Patent is hereby corrected as shown below:

COLUMN 9

Line 34, "138 is" should red --138, is--.

COLUMN 11

Line 6, "Accordingly" should read --Accordingly,--.
Line 8, "fingers This" should read --fingers.  This--.
Line 33, "however" should read --however,--.
Line 37, "push on" should read --push-on--.
Line 58, "push on" should read --push-on--.

COLUMN 12

Line 11, "respectively" should read --respectively,--.

UNITED STATES PATENT AND TRADEMARK OFFICE
CERTIFICATE OF CORRECTION

PATENT NO. : 5,205,762
DATED : April 27, 1993
INVENTOR(S) : WILLIAM V. CARNEY

Page 3 of 3

It is certified that error appears in the above-identified patent and that said Letters Patent is hereby corrected as shown below:

COLUMN 14

Line 46, "34bwhich" should read --34b which--.
Line 58, "is" should read --are--.

Signed and Sealed this

Nineteenth Day of April, 1994

*Attest:*

BRUCE LEHMAN

*Attesting Officer*      Commissioner of Patents and Trademarks